(12) United States Patent
Goto et al.

(10) Patent No.: US 12,259,162 B2
(45) Date of Patent: Mar. 25, 2025

(54) PROCESSING LIQUID TEMPERATURE CONTROL APPARATUS

(71) Applicant: KELK Ltd., Hiratsuka (JP)

(72) Inventors: Daisuke Goto, Hiratsuka (JP); Atsushi Kobayashi, Hiratsuka (JP)

(73) Assignee: KELK LTD., Hiratsuka (JP)

( * ) Notice: Subject to any disclaimer, the term of this patent is extended or adjusted under 35 U.S.C. 154(b) by 302 days.

(21) Appl. No.: 17/675,213

(22) Filed: Feb. 18, 2022

(65) Prior Publication Data

US 2022/0275979 A1    Sep. 1, 2022

(30) Foreign Application Priority Data

Mar. 1, 2021    (JP) .................... 2021-031479

(51) Int. Cl.
    *F25B 21/02*    (2006.01)
(52) U.S. Cl.
    CPC ........ *F25B 21/02* (2013.01); *F25B 2321/025* (2013.01)
(58) Field of Classification Search
    CPC .. F25B 21/02; F25B 2321/025; F28D 9/0093; F28D 9/0081; F28D 7/082; F28F 3/12; F28F 21/04; H01L 23/473
    See application file for complete search history.

(56) References Cited

U.S. PATENT DOCUMENTS

| | | | |
|---|---|---|---|
| 4,998,502 A | 3/1991 | Schucker | |
| 2008/0196863 A1 | 8/2008 | Takechi | |
| 2008/0236805 A1 | 10/2008 | Miki | |
| 2018/0112933 A1 | 4/2018 | Takagi et al. | |
| 2020/0018553 A1 | 1/2020 | Yano et al. | |
| 2020/0373638 A1* | 11/2020 | Lee .................. | H01M 10/6572 |
| 2021/0398799 A1 | 12/2021 | Kobayashi et al. | |

FOREIGN PATENT DOCUMENTS

| | | | | |
|---|---|---|---|---|
| CN | 101275776 A | 10/2008 | | |
| CN | 107532865 A | 1/2018 | | |
| CN | 110461464 A | 11/2019 | | |
| DE | 102008015328 A1 * | 10/2008 | ............ | F28F 21/065 |
| JP | 2008-202816 A | 9/2008 | | |
| JP | 2009-019805 A | 1/2009 | | |
| JP | 2016015466 A * | 1/2016 | ......... | H01L 23/3735 |
| JP | 2016-161161 A | 9/2016 | | |
| JP | 2019-168136 A | 10/2019 | | |
| JP | 2020-087979 A | 6/2020 | | |
| KR | 10-0793277 B1 | 1/2008 | | |

\* cited by examiner

*Primary Examiner* — Ana M Vazquez
(74) *Attorney, Agent, or Firm* — Troutman Pepper Locke LLP; James E. Armstrong, IV; Nicholas J. DiCeglie, Jr.

(57) ABSTRACT

A processing liquid temperature control apparatus includes a block body with an integral structure made of a silicon carbide sintered body, the block body having a flow path through which a semiconductor processing liquid flows, and a temperature adjustment portion provided at the block body to adjust a temperature of the semiconductor processing liquid flowing through the flow path. Accordingly, it is possible to reduce the number of parts and achieve compactness and cost reduction. In addition, it is possible to enhance heat conduction between the processing liquid and the temperature adjustment portion, and improve heat exchange efficiency.

7 Claims, 5 Drawing Sheets

PROCESSING LIQUID TEMPERATURE CONTROL APPARATUS

BACKGROUND OF THE INVENTION

Field of the Invention

The present invention relates to a processing liquid temperature control apparatus.

Priority is claimed on Japanese Patent Application No. 2021-031479, filed Mar. 1, 2021, the content of which is incorporated herein by reference.

Description of Related Art

For example, Japanese Unexamined Patent Application, First Publication No. 2008-202816 discloses a processing liquid temperature control apparatus that adjusts a temperature of a semiconductor processing liquid (hereinafter, simply referred to as a processing liquid). This apparatus has a block body in which a flow path groove is formed on a surface. A corrosion-resistant plate having corrosion resistance to the processing liquid, a heat exchanger plate formed of a metal material, and a Peltier module as a temperature adjustment portion are sequentially laminated on a surface of the block body. In this apparatus, heat exchange is performed with the temperature adjustment portion via the corrosion-resistant plate and the heat exchanger plate to adjust the temperature of the processing liquid.

SUMMARY OF THE INVENTION

In the above-mentioned processing liquid temperature control apparatus, two members, namely a corrosion-resistant plate and a heat exchanger plate, exist between the block body and the temperature adjustment portion. As a result, the number of parts of the apparatus as a whole is increased, leading to an increase in the size and cost of the apparatus. Further, the processing liquid temperature control apparatus is required to further improve heat exchange efficiency between the processing liquid and the temperature adjustment portion.

Therefore, an object of the present invention is to provide a processing liquid temperature control apparatus capable of achieving compactness and cost reduction, and improving heat exchange efficiency.

A processing liquid temperature control apparatus according to an aspect of the present invention includes a block body having an integral structure made of a silicon carbide sintered body, the block body having a flow path formed therein through which a semiconductor processing liquid flows, and a partition wall separating the flow path from outside, and a temperature adjustment portion provided on an outer surface of the block body to exchange heat with the semiconductor processing liquid via the partition wall.

According to the above aspect, it is possible to provide a processing liquid temperature control apparatus capable of achieving compactness and cost reduction, and improving heat exchange efficiency.

DETAILED DESCRIPTION OF THE INVENTION

Figure 1:
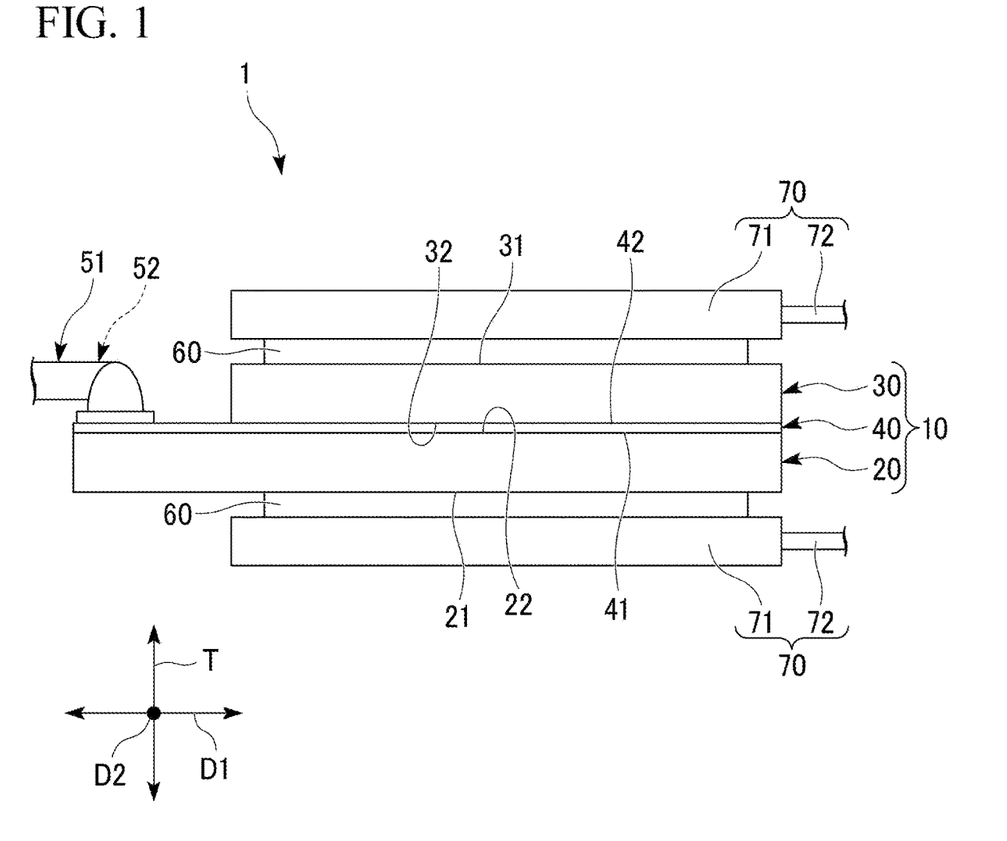
FIG. 1 is a side view of a processing liquid temperature control apparatus according to an embodiment.

In the following, an embodiment of the present invention will be described with reference to the drawings. A processing liquid temperature control apparatus 1 shown in FIG. 1 is used to adjust a temperature of a processing liquid (semiconductor processing liquid) used in a semiconductor manufacturing process. As the processing liquid, an acid-based aqueous solution such as hydrochloric acid, sulfuric acid, phosphoric acid or ozone water used for a wet process (RCA cleaning) and wet etching is used.

<Overall Configuration of Processing Liquid Temperature Control Apparatus>

As shown in FIG. 1, the processing liquid temperature control apparatus 1 includes a block body 10, a first processing liquid pipe 51, a second processing liquid pipe 52, a pair of temperature adjustment portions 60, 60, and a pair of water jackets 70, 70.

<Block Body>

Figure 2:
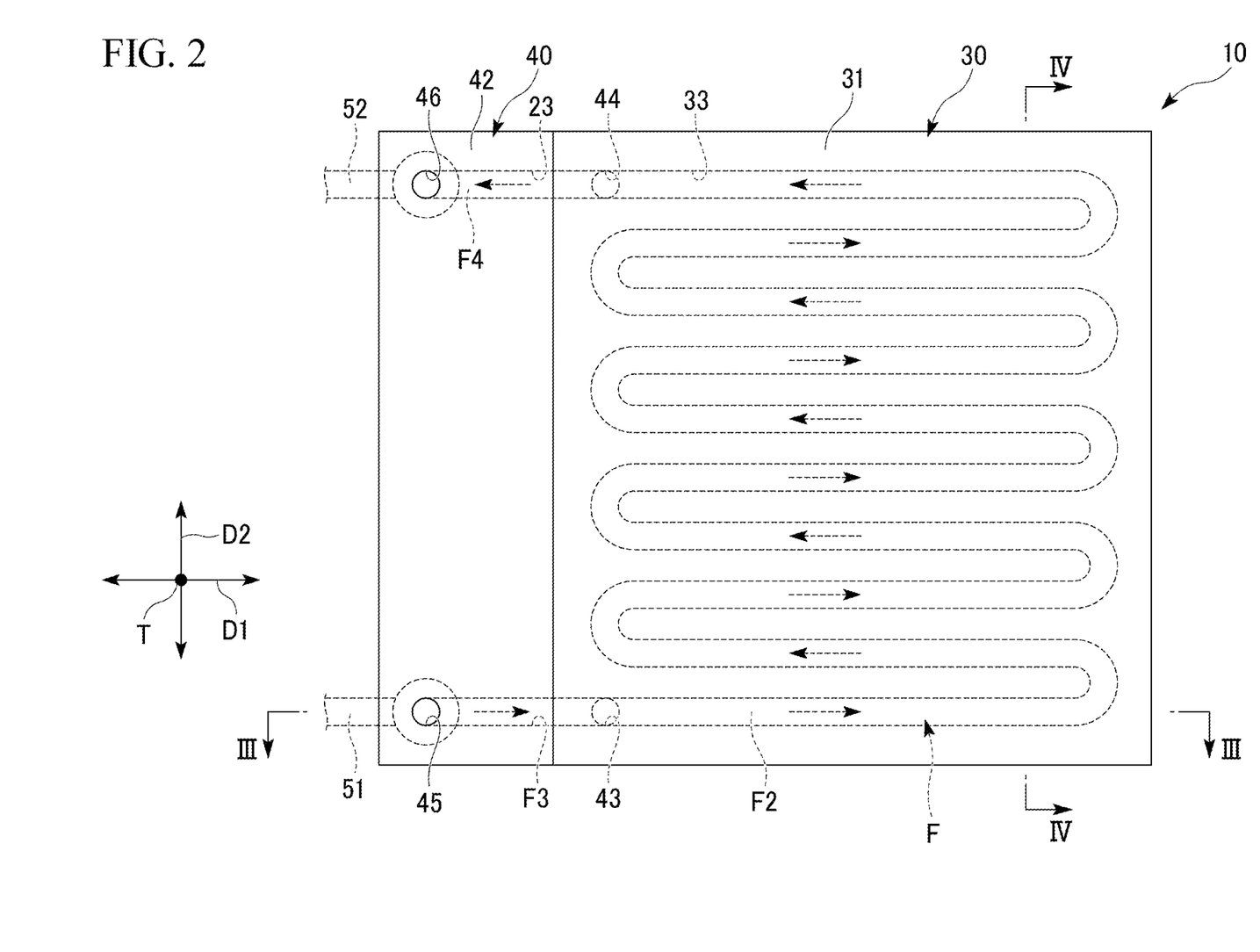
FIG. 2 is a plan view of a block body of the processing liquid temperature control apparatus according to the embodiment.
Figure 3:
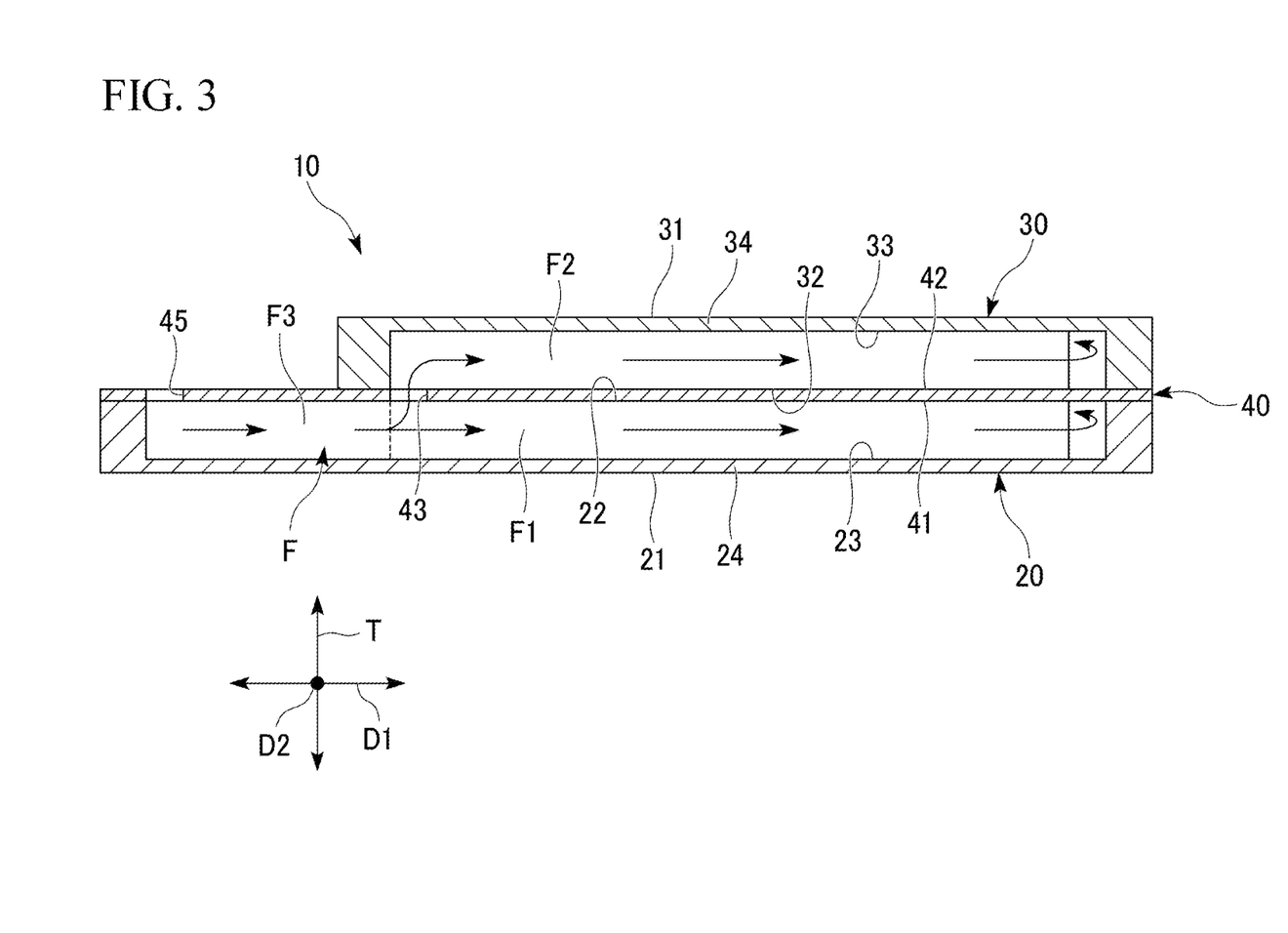
FIG. 3 is a cross-sectional view taken along line III-III in FIG. 2.
Figure 4:
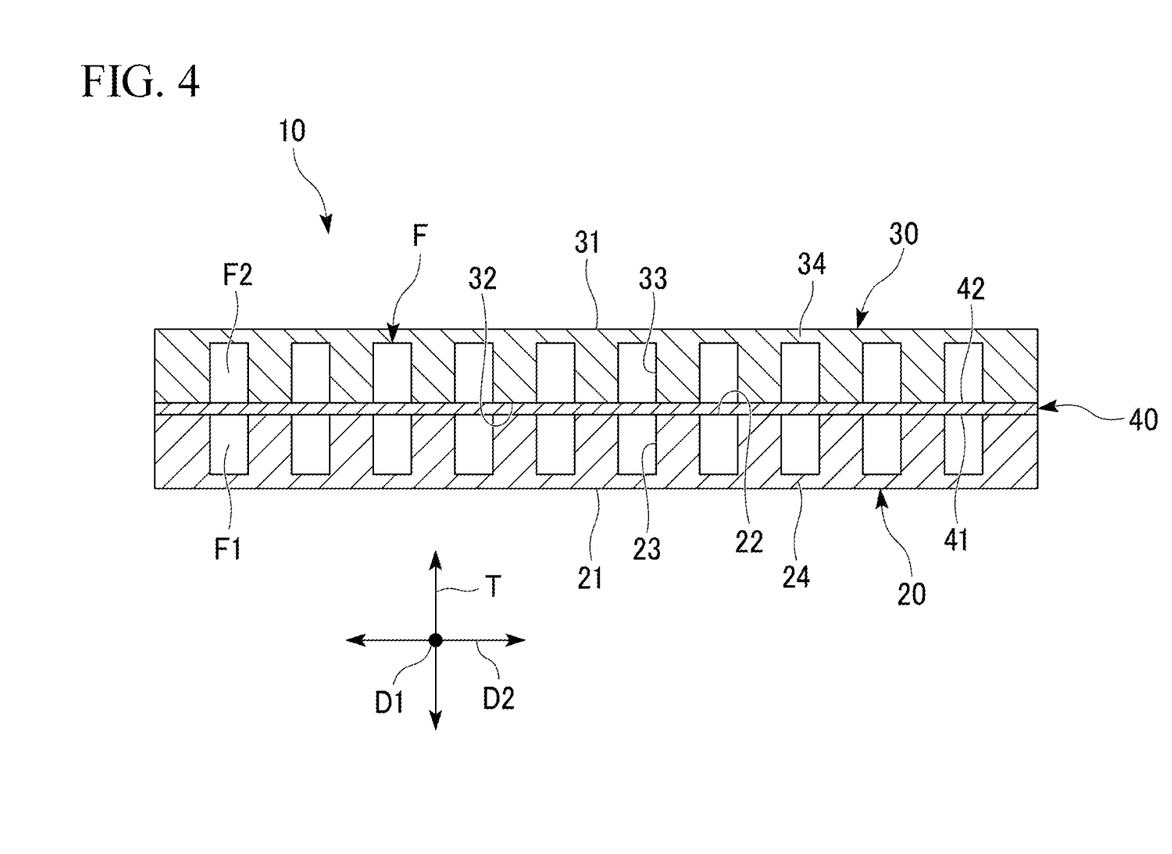
FIG. 4 is a cross-sectional view taken along line IV-IV of FIG. 2.

The block body 10 has a block shape made of a silicon carbide sintered body. As shown in FIGS. 2 to 4, a flow path F through which the processing liquid flows is formed inside the block body 10. The block body 10 has a flat plate shape. As shown in FIG. 1, the block body 10 has a first main surface 21 and a second main surface 31 which are outer surfaces arranged apart from each other in a thickness direction T of the block body 10. The first main surface 21 and the second main surface 31 are flat surfaces and are parallel to each other.

<First Processing Liquid Pipe, Second Processing Liquid Pipe>

As shown in FIGS. 1 and 2, the first processing liquid pipe 51 and the second processing liquid pipe 52 are connected to the block body 10. The first processing liquid pipe 51 is a pipe for supplying the processing liquid into the block body 10, and the second processing liquid pipe 52 is a pipe for discharging the processing liquid from the inside of the block body 10 to the outside. The first processing liquid pipe 51 and the second processing liquid pipe 52 are made of a material having corrosion resistance to the processing liquid such as PTFE and PFA. End portions of the first processing liquid pipe 51 and the second processing liquid pipe 52 are fixed to the block body 10 by, for example, bolting. Sealing members such as O-rings are provided at connection points between the first processing liquid pipe 51 and the block body 10 and between the second processing liquid pipe 52 and the block body 10 to prevent the processing liquid from leaking to the outside.

<Temperature Adjustment Portion>

As shown in FIG. 1, a pair of temperature adjustment portions 60, 60 are each provided so as to correspond to the first main surface 21 and the second main surface 31 of the block body 10. The temperature adjustment portions 60, 60 have a flat plate shape laminated on the first main surface 21 and the second main surface 31. No other sheet, flat plate, or the like is interposed between the temperature adjustment portions 60, 60 and the first main surface 21, the second main surface 31. That is, the temperature adjustment portions 60, 60 are directly in contact with the first main surface 21 and the second main surface 31.

In the present embodiment, a Peltier module configured with a Peltier element is used as the temperature adjustment portions 60, 60.

<Water Jacket>

A pair of water jackets 70, 70 are provided on surfaces of the temperature adjustment portions 60, 60 which are opposite surfaces where the block body 10 is located so as to correspond to each of the temperature adjustment portions 60, 60. The water jacket 70 has a heat dissipation block 71 in a flat plate shape that is laminated on the temperature adjustment portion 60, and a cooling water pipe 72 provided so as to pass through an inside of the heat dissipation block 71.

In this manner, the processing liquid temperature control apparatus 1 has a structure in which the temperature adjustment portions 60, 60 and the water jackets 70, 70 are each laminated on both sides of the block body 10 in a thickness direction T. The block body 10 is integrally fixed to the temperature adjustment portion 60 and the water jacket 70, for example, by a fixing member, such as a bolt passing therethrough in the thickness direction T.

<Detailed Configuration of Block Body>

In the following, the configuration of the block body 10 will be described in more detail.

As shown in FIGS. 1, 3, and 4, the block body 10 is configured with a first silicon carbide material 20, a second silicon carbide material 30, and a third silicon carbide material 40, which are each formed of silicon carbide.

<First Silicon Carbide Material 20>

As shown in FIG. 1, the first silicon carbide material 20 has a flat plate shape in a rectangular shape that extends in a first direction D1 and a second direction D2 orthogonal to the thickness direction T and orthogonal to each other. A surface at one side (lower side in FIGS. 1, 3, and 4) of the first silicon carbide material 20 in the thickness direction T is defined as a first main surface 21.

A surface opposite to the first main surface 21 of the first silicon carbide material 20, that is, the other side (an upper side of FIGS. 1, 3 and 4) in the thickness direction T, is defined as a first joint surface 22. The first joint surface 22 is a plane parallel to the first main surface 21.

As shown in FIGS. 3 and 4, the first silicon carbide material 20 is formed with a first flow path groove 23 so as to be recessed from the first joint surface 22 to one side in the thickness direction T. The first flow path groove 23 extends in a direction along a virtual surface including the first direction D1 and the second direction D2. A thickness of a partition wall 24 of the first silicon carbide material 20 that separates the first flow path groove 23 and the first main surface 21 in the thickness direction T, that is, a dimension in the thickness direction T1, is set to, for example, 0.5 to 5.0 mm, and more preferably 0.5 mm to 3.0 mm.

<Second Silicon Carbide Material>

As shown in FIGS. 1 and 2, the second silicon carbide material 30 has a flat plate shape in a rectangular shape that extends in the first direction D1 and the second direction D2 as similar to the first silicon carbide material. A dimension of the second silicon carbide material 30 in the first direction D1 is smaller than that of the first silicon carbide material 20. A dimension of the second silicon carbide material 30 in the second direction D2 is the same as that of the first silicon carbide material 20. A surface at one side of the first silicon carbide material 20 in the thickness direction T is defined as a second main surface 31.

As shown in FIGS. 1, 3 and 4, a surface opposite to the second main surface 31 of the second silicon carbide material 30, that is, a surface at one side in the thickness direction T, is defined as a second joint surface 32. The second joint surface 32 is a plane parallel to the second main surface 31.

As shown in FIGS. 3 and 4, a second flow path groove 33 is formed in the second joint surface 32 so as to be recessed from the second joint surface 32 to the other side in the thickness direction T. The second flow path groove 33 extends in a direction along the virtual surface including the first direction D1 and the second direction D2. A thickness of the partition wall 34 of the second silicon carbide material 30 that separates the second flow path groove 33 and the second main surface 31 in the thickness direction T is set to, for example, 0.5 to 5.0 mm, and more preferably 0.5 mm to 3.0 mm.

<Third Silicon Carbide Material>

As shown in FIG. 1, the third silicon carbide material 40 has a sheet shape extending in a rectangular shape in the first direction D1 and the second direction D2. As shown in FIG. 2, the dimensions of the first direction D1 and the second direction D2 of the third silicon carbide material 40 are the same as the dimensions of the first direction D1 and the second direction D2 of the first silicon carbide material 20.

As shown in FIGS. 1, 3 and 4, a surface at one side of the third silicon carbide material 40 in the thickness direction T is defined as a first sheet surface 41. A surface at the other side of the third silicon carbide material 40 in the thickness direction T is defined as a second sheet surface 42. As shown in FIGS. 2 and 3, a first communication hole 43, a second communication hole 44, an inlet opening portion 45, and an outlet opening portion 46 that each pass through the first sheet surface 41 and the second sheet surface 42 in the thickness direction T are formed in the third silicon carbide material 40. A thickness of the third silicon carbide material 40, that is, a dimension in the thickness direction, is set to, for example, 0.5 to 5.0 mm, and more preferably 0.5 mm to 3.0 mm. That is, a thickness of the partition wall 24 of the first silicon carbide material 20, a thickness of the partition wall 34 of the second silicon carbide material 30, and a thickness of the third silicon carbide material 40 are the same as one another.

<Silicon Carbide Sintered Body>

The block body 10 is produced by integrally sintering the first silicon carbide material 20, the second silicon carbide material 30, and the third silicon carbide material 40.

When the block body 10 is sintered and produced, as shown in FIG. 1, the third silicon carbide material 40 is disposed so as to be interposed between the first joint surface 22 of the first silicon carbide material 20 and the second joint surface 32 of the second silicon carbide material 30. Accordingly, an entire region of the first joint surface 22 of the first silicon carbide material 20 is covered with the first sheet surface 41 of the third silicon carbide material 40. The second silicon carbide material 30 is laminated on the second sheet surface 42 of the third silicon carbide material 40 so as to be unevenly distributed at one side of the first direction D1 (a right side of FIGS. 1 to 4). As a result, an entire region of the second joint surface 32 of the second sheet surface 42 is covered with the second sheet surface 42 of the third silicon carbide material 40. Furthermore, a region at the other side of the second sheet surface 42 of the third silicon carbide material 40 in the first direction D1 (a left side in FIGS. 1 to 4) is exposed to the outside. When laminating the first silicon carbide material 20, the second silicon carbide material 30, and the third silicon carbide material 40, an adhesive is interposed therebetween. As a result, an integral structure of the first silicon carbide material 20, the second silicon carbide material 30, and the third silicon carbide material 40 can be obtained.

By performing heat treatment on the integral structure of the first silicon carbide material 20, the second silicon carbide material 30, and the third silicon carbide material 40 at a high temperature, the block body 10 is produced as a silicon carbide sintered body of the first silicon carbide material 20, the second silicon carbide material 30, and the third silicon carbide material 40.

<Flow Path in Block Body>

The flow path F inside the block body is partitioned by the first flow path groove 23 of the first silicon carbide material 20, the second flow path groove 33 of the second silicon carbide material 30, and the first sheet surface 41 and the second sheet surface 42 of the third silicon carbide material 40.

A first meandering flow path F1, an inlet flow path F3, and an outlet flow path F4 are formed by the first flow path groove 23 of the first silicon carbide material 20 and the first sheet surface 41 of the third silicon carbide material 40.

As shown in FIG. 3, the first meandering flow path F1 is formed at a position biased to one side of the first direction D1. The first meandering flow path F1 is the flow path F extending toward the second direction D2 while reciprocating between one side and the other side of the first direction D1.

The inlet flow path F3 is connected to an end portion at one side (a lower side in FIG. 2) of the first meandering flow path F1 in the second direction D2, which is an inlet side of the processing liquid, and extends to a corner portion at the other side of the first direction D1 and the one side of the second direction D2. The inlet flow path F3 communicates with the first processing liquid pipe 51 via the inlet opening portion 45 of the third silicon carbide material 40.

The outlet flow path F4 is connected to an end portion at the other side (an upper side in FIG. 2) of the first meandering flow path F1 in the second direction D2, which is an outlet side of the processing liquid, and extends to a corner portion at the other side of the first direction D1 and the other side of the second direction D2. The outlet flow path F4 communicates with the second processing liquid pipe 52 via the outlet opening portion 46 of the third silicon carbide material 40.

A second meandering flow path F2 is formed by the second flow path groove 33 of the second silicon carbide material 30 and the second sheet surface 42 of the third silicon carbide material 40. The second meandering flow path F2 is formed in a region overlapping the first meandering flow path F1 in plan view. That is, the second meandering flow path F2 is the flow path F extending toward the second direction D2 while reciprocating between the one side and the other side of the first direction D1, similarly to the first meandering flow path F1.

An end portion at one side of the second direction D2, which is an inlet side of the processing liquid of the second meandering flow path F2, communicates with the first meandering flow path F1 through the first communication hole 43 of the third silicon carbide material 40.

An end portion at the other side of the second direction, which is an outlet side of the processing liquid of the second meandering flow path F2, communicates with the first meandering flow path F1 through the second communication hole 44 of the third silicon carbide material 40.

<Operation of Processing Liquid Temperature Control Apparatus>

When the temperature of the processing liquid is adjusted by the processing liquid temperature control apparatus 1 having the above configuration, the processing liquid is led into the flow path F of the block body 10 via the first processing liquid pipe 51. The processing liquid led into the block body 10 from the first processing liquid pipe 51 passes through the inlet flow path F3 and is led in parallel with the first meandering flow path F1 and the second meandering flow path F2. The processing liquid is temperature-adjusted by the temperature adjustment portion 60 disposed on the first main surface 21 and the second main surface 31 in a process of flowing through the first meandering flow path F1 and the second meandering flow path F2.

That is, heat exchange is performed between the Peltier element and the processing liquid via the partition walls 24, 34 of the first silicon carbide material 20 and the second silicon carbide material 30 by energizing the Peltier module. As a result, the temperature of the processing liquid is adjusted to an appropriate value. Furthermore, at this time, heat dissipation or heat supply of the Peltier module is performed by the water jacket 70.

Then, the processing liquid having an appropriate temperature by the temperature adjustment portion 60 flows from the first meandering flow path F1 and the second meandering flow path F2 into the outlet flow path F4, and then is guided to the second processing liquid pipe 52 via the outlet opening portion 46. As a result, the processing liquid is discharged to the outside of the processing liquid temperature control apparatus 1.

Advantageous Effects

The processing liquid led into the processing liquid temperature control apparatus 1 is highly corrosive. Therefore, a material forming the flow path F through which the processing liquid passes is required to have high corrosion resistance.

Recent advances in silicon carbide manufacturing technology have made it possible to manufacture high-purity silicon carbide materials with fewer mixed impurities such as metal powder during the manufacturing process. When impurities are mixed in the silicon carbide material, corrosion is likely to occur starting from the place where the impurities are mixed. On the contrary, in the case of a high-purity silicon carbide material, there is no need to worry about corrosion since it exhibits high corrosion resistance to the processing liquid.

Under such a background, the block body 10 of the present embodiment is configured with a silicon carbide sintered body made of a high-purity silicon carbide material. As a result, it is possible to prevent the block body 10 itself from being corroded by the processing liquid flowing in the flow path F.

By forming the flow path F of the processing liquid only with the silicon carbide material in this manner, it is not required to provide a member having high corrosion resistance such as a corrosion-resistant plate or a heat exchanger plate for holding the corrosion-resistant plate. As a result, only the partition walls 24, 34 of the first silicon carbide material 20 and the second silicon carbide material 30 are placed between the processing liquid flowing through the flow path F and the temperature adjustment portions 60, 60 for adjusting the temperature of the processing liquid. Therefore, it is possible to reduce the number of parts of the processing liquid temperature control apparatus 1 as a whole, and make the apparatus compact while avoiding cost increase.

In addition, since the silicon carbide material itself has corrosion resistance, a thickness of the partition walls 24, 34 between the processing liquid and the temperature adjustment portion in the block body 10 can be reduced. Accordingly, a thickness of the partition walls 24, 34 can be set to, for example, 0.5 to 5.0 mm, and more preferably 0.5 mm to 3.0 mm. By sufficiently reducing a distance between the processing liquid and the temperature adjustment portion 60 in this manner, the dimension in the thickness direction T can be made smaller, and the apparatus as a whole can be further made compact.

Moreover, by reducing the thickness of the partition walls 24, 34 in the block body 10 in this manner, heat exchange efficiency between the processing liquid and the temperature adjustment portion 60 can be improved. A thermal conductivity of the silicon carbide material itself is smaller than those of the corrosion-resistant plate and the heat exchanger plate conventionally used. By making the partition walls 24, 34 made of a silicon carbide material as thin as the above dimension, the heat capacity of the partition walls 24, 34 can be made sufficiently smaller than before. Accordingly, heat exchange between the processing liquid and the temperature adjustment portion 60 can be promoted, and the responsiveness of a temperature change in the processing liquid by the temperature adjustment portion 60 can be improved.

Furthermore, the block body 10 of the present embodiment can be obtained by laminating a plurality of silicon carbide materials formed with a flow path groove and performing heat treatment thereon. Therefore, the block body 10 having high corrosion resistance and high heat exchange efficiency can be easily obtained without using a special manufacturing method.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

For example, in the embodiment, an example in which the Peltier module is employed as the temperature adjustment portion 60 has been described, but another configuration such as a heater may be employed as long as the temperature of the processing liquid can be adjusted.

In the embodiment, the flow path F of the block body 10 includes the first meandering flow path F1 and the second meandering flow path F2, but for example, may also be configured to have only the first meandering flow path F1. In this case, the temperature adjustment portion 60 may be provided only on the first main surface 21 between the first main surface 21 and the second main surface 31. That is, it is not always necessary to provide a pair of temperature adjustment portions 60, and a configuration provided with only one may be sufficient.

Figure 5:
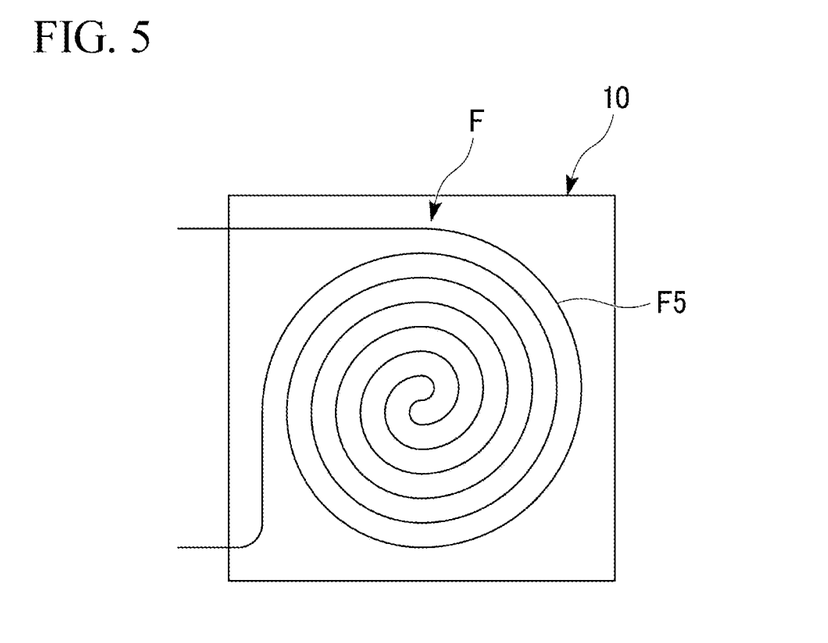
FIG. 5 is a first modification of a flow path of the processing liquid temperature control apparatus according to an embodiment.
Figure 6:
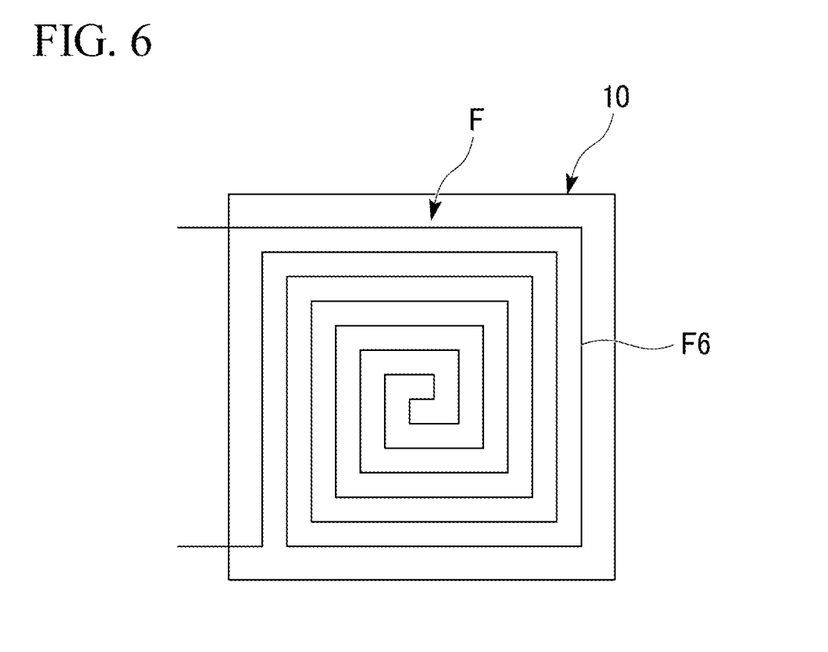
FIG. 6 is a second modification of the flow path of the processing liquid temperature control apparatus according to an embodiment.

In addition, in the embodiment, a portion of the block body 10 that performs heat exchange in the flow path F has a meandering shape such as the first meandering flow path F1 and the second meandering flow path F2, but the present invention is not limited thereto. For example, the flow path F may be a convoluted flow path F5 as shown in FIG. 5 or a square spiral flow path F6 as shown in FIG. 6.

Moreover, in the embodiment, an example in which the block body 10 is configured with the first silicon carbide material 20, the second silicon carbide material 30, and the third silicon carbide material 40 has been described, but the present invention is not limited thereto. The block body 10 may be formed by two of these three silicon carbide materials. Furthermore, a block body having a more complicated flow path may be formed by using four or more silicon carbide materials. The shape of the flow path is not limited to the embodiment and can be changed to any shape.

EXPLANATION OF REFERENCES

1 . . . Processing liquid temperature control apparatus
10 . . . Block body
20 . . . First silicon carbide material
21 . . . First main surface
22 . . . First joint surface
23 . . . First flow path groove
24 . . . Partition wall
30 . . . Second silicon carbide material
31 . . . Second main surface
32 . . . Second joint surface
33 . . . Second flow path groove
34 . . . Partition wall
40 . . . Third silicon carbide material
41 . . . First sheet surface
42 . . . Second sheet surface
43 . . . First communication hole
44 . . . Second communication hole
45 . . . Lead-in opening portion
46 . . . Lead-out opening portion
51 . . . First processing liquid pipe
52 . . . Second processing liquid pipe
60 . . . Temperature adjustment portion
70 . . . Water jacket
71 . . . Heat dissipation block
72 . . . Cooling water pipe
F . . . Flow path
F1 . . . First meandering flow path
F2 . . . Second meandering flow path
F3 . . . Lead-in flow path
F4 . . . Lead-out flow path
T . . . Thickness direction
D1 . . . First direction
D2 . . . Second direction

What is claimed is:

1. A processing liquid temperature control apparatus, comprising:
a block body having an integral structure made of a silicon carbide sintered body, the block body having a flow path formed therein through which a semiconductor processing liquid flows, and a partition wall separating the flow path from outside; and
a temperature adjustment portion provided on an outer surface of the block body to exchange heat with the semiconductor processing liquid via the partition wall,
wherein in a first direction and a second direction orthogonal to a thickness direction and orthogonal to each other, the flow path extends toward the second direction while reciprocating between one side and the other side of the first direction,
wherein the flow path includes a first flow path and a second flow path overlapping the first flow path in plan view, wherein the block body includes:
a first main surface and a second main surface as the outer surfaces arranged apart from each other in the thickness direction;
a first silicon carbide material having a surface as the first main surface of the block body and having a first flow path groove that forms a part of the flow path on a surface opposite to the first main surface;
a second silicon carbide material having a surface as the second main surface of the block body and having a second flow path groove that forms a part of the flow path on a surface opposite to the second main surface; and
a third silicon carbide material provided between the first silicon carbide material and the second silicon carbide material to form a first flow path together with the first flow path groove and a second flow path together with the second flow path groove, the third silicon carbide material having a communication portion that allows the first flow path and the second flow path to communicate with each other, and
wherein the block body has an integral structure made of the first silicon carbide material, the second silicon carbide material, and the third silicon carbide material.

2. The processing liquid temperature control apparatus according to claim 1, wherein a thickness of the partition wall is in a range of 0.5 to 5.0 mm.

3. The processing liquid temperature control apparatus according to claim 2,
wherein the temperature adjustment portion is a Peltier module composed of a Peltier element.

4. The processing liquid temperature control apparatus according to claim 1,
wherein the temperature adjustment portion is provided in contact with each of the first main surface and the second main surface.

5. The processing liquid temperature control apparatus according to claim 4,
wherein the temperature adjustment portion is a Peltier module composed of a Peltier element.

6. The processing liquid temperature control apparatus according to claim 1,
wherein the temperature adjustment portion is a Peltier module composed of a Peltier element.

7. The processing liquid temperature control apparatus according to claim 1,
wherein the first flow path is a meandering flow path that extends toward the second direction while reciprocating between one side and the other side of the first direction, and
wherein the second flow path is a meandering flow path that extends toward the second direction while reciprocating between one side and the other side of the first direction.

* * * * *